(12) United States Patent
Lu et al.

(10) Patent No.: US 7,348,832 B2
(45) Date of Patent: Mar. 25, 2008

(54) DUAL-VOLTAGE GENERATION SYSTEM

(75) Inventors: Hsiang-Tai Lu, Hsinchu (TW); Cheng-Hsiung Kuo, Jhubei (TW); Yue-Der Chih, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 38 days.

(21) Appl. No.: 11/384,846

(22) Filed: Mar. 20, 2006

(65) Prior Publication Data

US 2007/0216471 A1 Sep. 20, 2007

(51) Int. Cl.
*G05F 1/10* (2006.01)
(52) U.S. Cl. .................. 327/538; 327/540; 327/541; 365/185.18; 365/185.19

(58) Field of Classification Search ................ 327/538, 327/540, 541; 365/185.18, 185.19
See application file for complete search history.

(56) References Cited

U.S. PATENT DOCUMENTS

| 5,726,944 | A | 3/1998 | Pelley, III et al. |
| 6,373,325 | B1 * | 4/2002 | Kuriyama ................ 327/536 |
| 6,385,086 | B1 * | 5/2002 | Mihara et al. ......... 365/185.11 |

* cited by examiner

*Primary Examiner*—Kenneth B. Wells
(74) *Attorney, Agent, or Firm*—Kirkpatrick & Lockhart Preston Gates Ellis LLP

(57) ABSTRACT

A voltage generation system for generating operating voltages for memory devices, especially non-volatile memories, from a single external high voltage source. In one embodiment, the system comprises an input terminal for receiving an external voltage, a charge pump for producing a first high voltage based on the external voltage to be higher than the external voltage, a first regulating circuit for regulating the first high voltage to a lower predetermined voltage, a second regulating circuit for generating a second high voltage based on the external voltage to be lower than the external voltage.

18 Claims, 5 Drawing Sheets

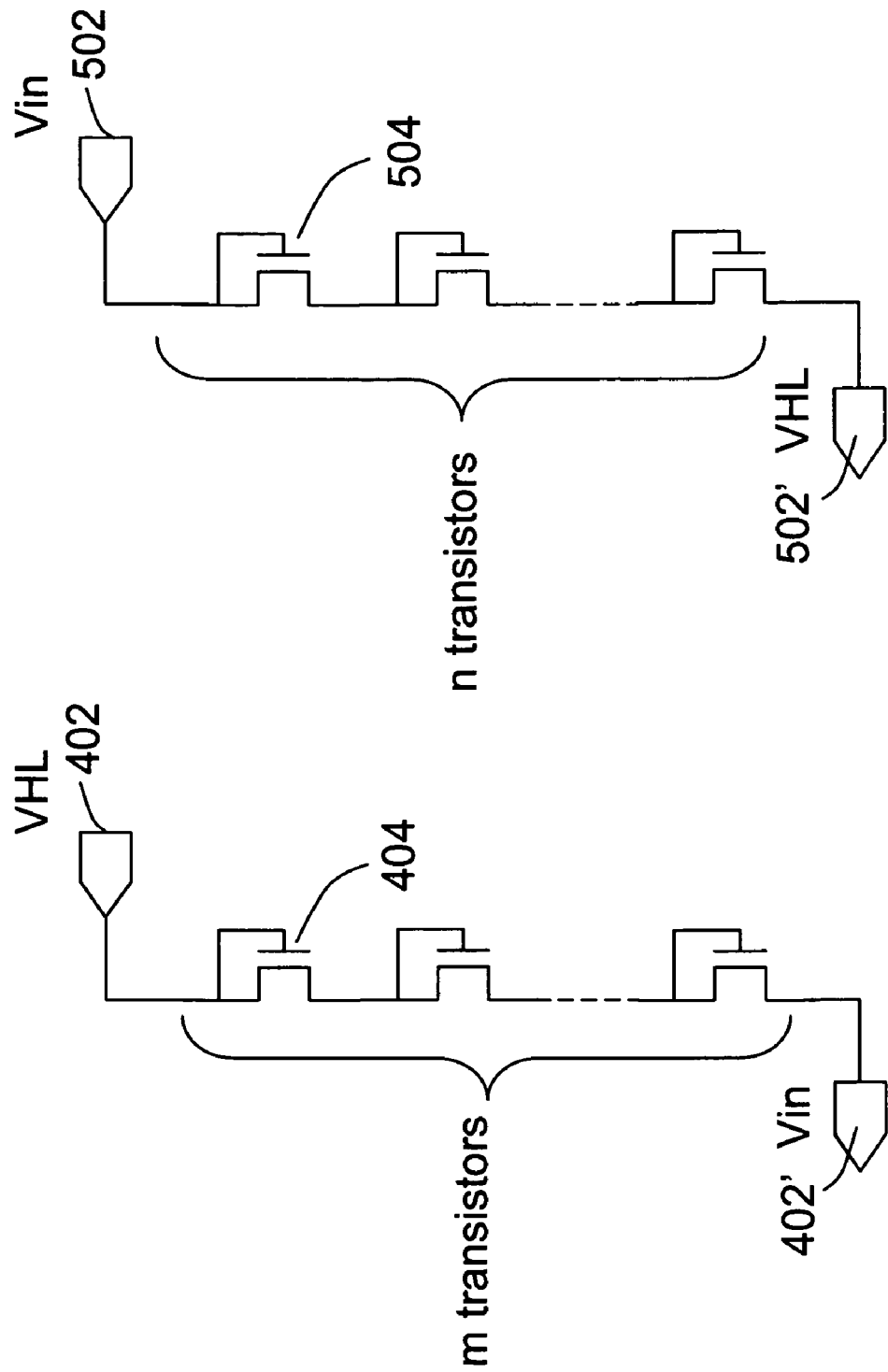

DUAL-VOLTAGE GENERATION SYSTEM

BACKGROUND

This invention relates to high voltage generation systems for semiconductor memory devices, and more particularly to systems for providing high voltages required to program memory devices.

Non-volatile memory devices, such as electrically erasable programmable read-only memories (EEPROM), including flash EEPROMs memories, are widely used. Flash memories comprise memory cell transistors, each have a floating gate, a control gate, a source and a drain. As such, each memory cell transistor retains binary information representing a charge injection state of its floating gate. For example, electrically charging the floating gate of a memory cell transistor brings a threshold voltage of that memory cell into a high state. When the threshold voltage is raised relative to the control gate, the memory cell prevents a current from flowing. Electrically discharging the floating gate of the memory cell lowers the threshold voltage with respect to the control gate, which allows the current to flow through the memory cell. Illustratively, bringing the threshold voltage of the memory cell higher than a word line selecting voltage level of a read state is called an erasure operation. On the other hand, bringing the threshold voltage of the memory cell lower than the word line selecting voltage level of the read state is called a programming operation. Alternatively, the erasure state and the programming state may be defined inversely in terms of threshold voltage.

In flash memory operation, higher voltage level than external power supply is used for erase operation, and lower voltage level than external power supply is used for program operation. Also, in flash memory operation, the voltage level needs to be monitored. Conventionally, a high voltage pad is needed for monitoring the high voltage level.

In a conventional system for generating high voltage for programming and erasing data from flash memory device, it includes a current reference, a current controlled oscillator, a clock generator, a charge pumping circuit, a high voltage regulator and feedback circuit. Such systems have complicated circuit designs that also require large areas on the chip. Therefore, conventional systems are not suitable for low cost non-volatile memory applications.

Desirable in the art are additional designs of a high voltage generation systems that provide simpler regulating circuits for regulating program and erase voltages, and monitoring the high voltage level thereof.

SUMMARY

In view of the foregoing, the following provides a system for generating high voltages for programming and erasing data in memory devices such as non-volatile memory devices from a single external high voltage source. In one embodiment, the system comprises an input terminal for receiving an external voltage, a charge pump for producing a first high voltage based on the external voltage to be higher than the external voltage, a first regulating circuit for regulating the first high voltage to a lower predetermined voltage, a second regulating circuit for generating a second high voltage based on the external voltage to be lower than the external voltage.

Another aspect of the invention is a monitoring circuit for converting the first or the second high voltage to a low voltage signal that can be determined and monitored in the memory circuit.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a circuit diagram of a first regulating circuit used in the system of FIG. 1.

FIG. 5 is a circuit diagram of a second regulating circuit used in the system of FIG. 1.

DESCRIPTION

The following will provide a detailed description of a high voltage system for programming and erasing data of memory devices such as non-volatile memories, especially flash memories.

Figure 1:
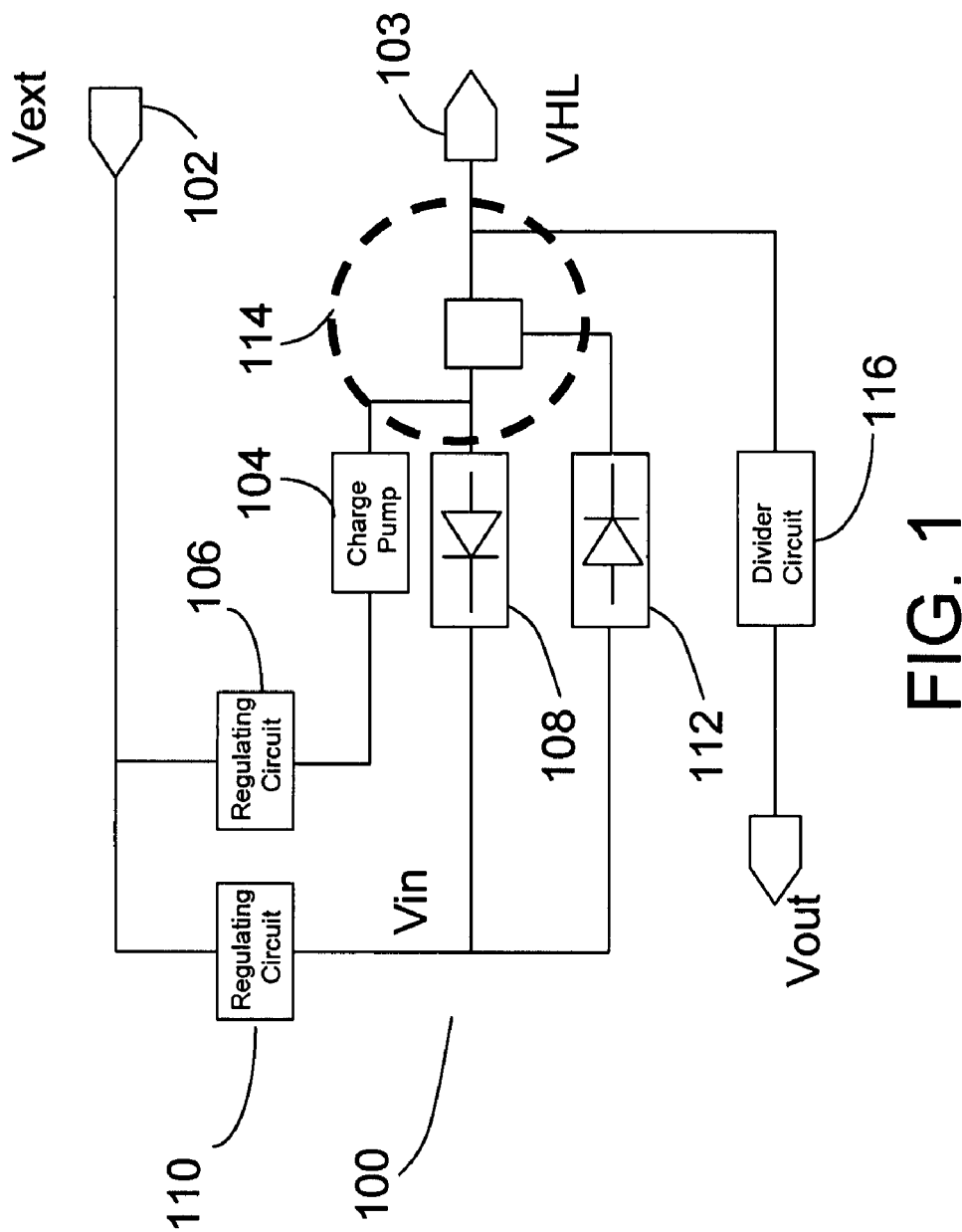
FIG. 1 is a block diagram of a high voltage generation system where dual-level high voltage output is generated according to one embodiment of the invention.

In FIG. 1, a system 100 is shown. An external high voltage Vext is applied to an input terminal 102 and high voltage output is generated on output terminal 103. The system includes a subsystem for generating a first high voltage (which will be further described in connection with FIG. 2). The first voltage is higher than the external high voltage and is used for erasing information from the non-volatile memory. The system also includes a subsystem for generating a second high voltage that is lower than the external high voltage (which will be further discussed in connection with FIG. 3). The second high voltage is used for programming (or writing into) the non-volatile memory.

Figure 2:
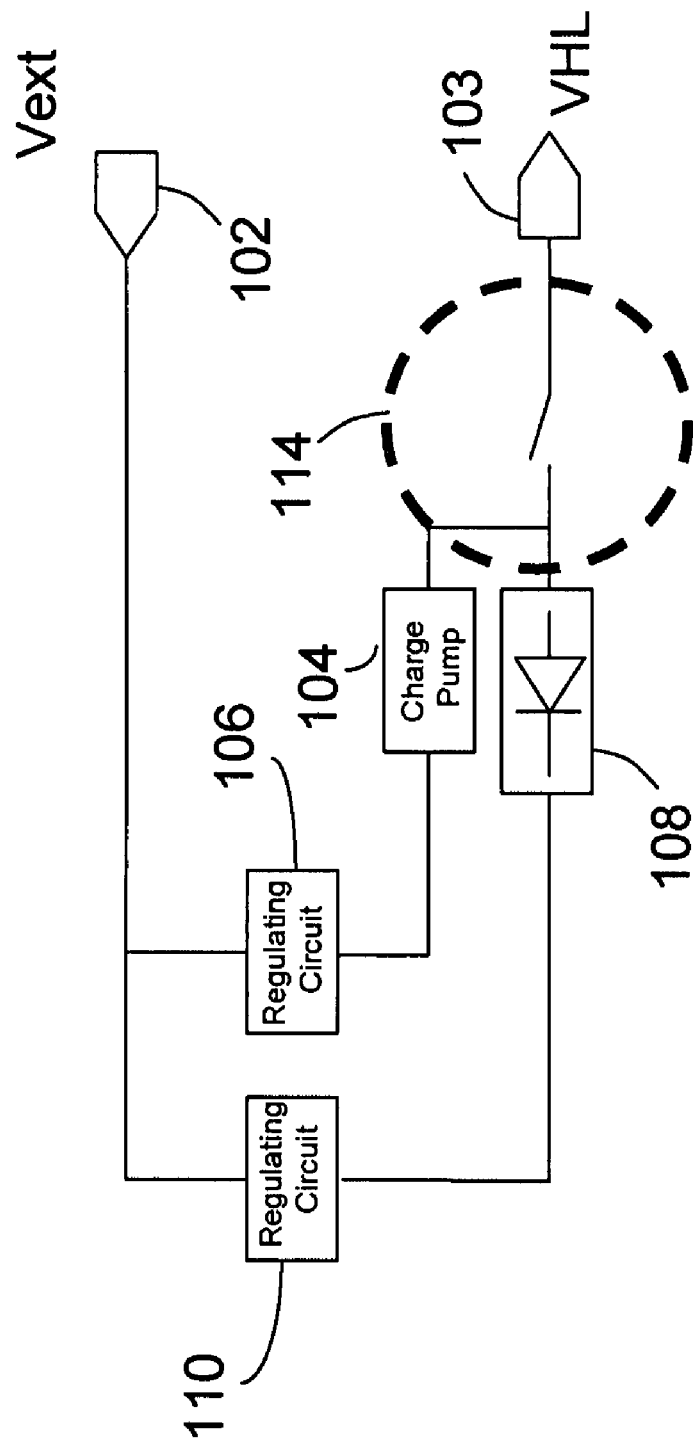
FIG. 2 is a block diagram illustrating elements of the system of FIG. 1 for generating a first voltage.

FIG. 2 depicts a subsystem for generating the first high voltage according to one embodiment of the present invention. The first high voltage generated can be used for erase operation in a non-volatile memory. It comprises a charge pump 104, connected to the external high voltage through a first transceiver 106. The designs of both charge pumps and transceivers are not illustrated here as they are widely used in the art and readily available for the person skilled in the art. The subsystem also comprises a first regulating circuit 108 for regulating the level of the high voltage. A switching circuit 114 selectively makes connections for providing a first high voltage as an output to the pad 103 from the charge pump. The first regulating circuit 108 regulates such output and reduces it to a lower voltage. The first high voltage may be higher than the external high voltage source so that a predetermined voltage for erasing the memory data can be obtained.

Figure 3:
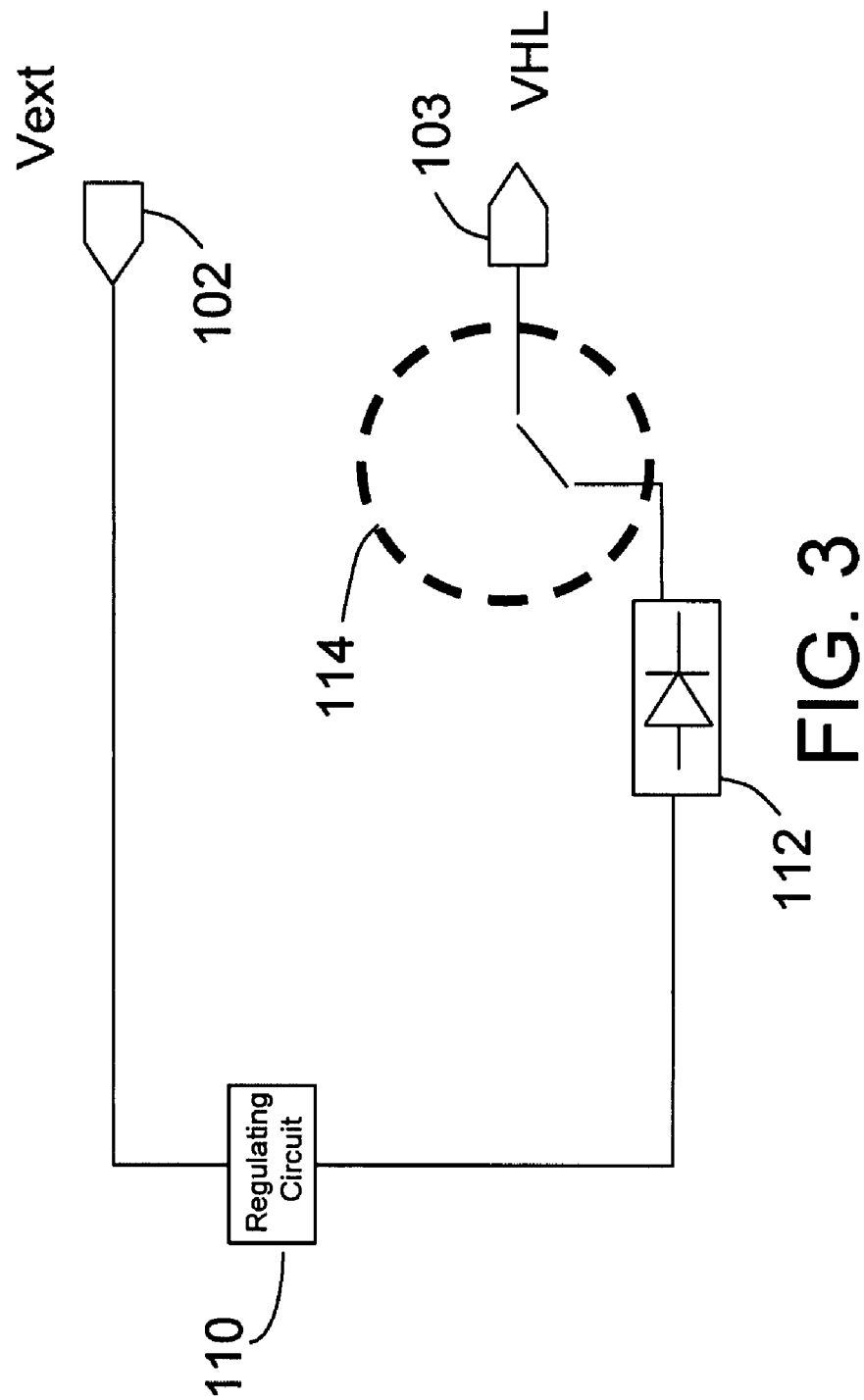
FIG. 3 is a block diagram illustrating elements of the system of FIG. 1 for generating a second voltage.

FIG. 3 illustrates a subsystem for generating the second high voltage that is lower than the external high voltage according to one embodiment of the present invention. This generated second high voltage may be lower than the externally provided high voltage source Vext and can be used for program (write) operation in a non-volatile memory. It comprises a transceiver 110, connected to the external voltage, and a second regulating circuit 112. The first high voltage and the second high voltage are selectively connected to the output terminal 103 through switching circuit 114. The switching circuits can be of various designs, which are largely known in the art.

The first regulating circuit 108 according to one embodiment is depicted in FIG. 4. It has input 402 and output 402'. Input 402 is coupled to the output of the charge pump 104 through the switch circuit 114. Output terminal 402' is connected to the output of the second transceiver 110. The first regulating circuit 108 further comprises a set of serially coupled transistors 404. For illustration purposes, one or more NMOS transistors are used, wherein m is the number of serially coupled transistors. A first transistor 404 has its drain coupled with the input 402. A source of the last transistor is connected with the output 402'. Each transistor 404 has its gate coupled to its drain so that the transistor operates as a diode. The total voltage drop in a higher voltage regulating circuit 108 is m*VDS (where VDS is the forward drain to source voltage drop of each transistor 404). As such, the first regulating circuit 108 limits the first high voltage to $V_{HL}$−m*VDS.

The second regulating circuit 112 is depicted in FIG. 5 and can be designed similarly to the first regulating circuit 108. The second regulating circuit 112 has input 502 and output 502'. The input 502 is connected to the switch circuit 114, through which it is selectively connected to the output terminal 103 of the system. The second regulating circuit also comprises a set of serially coupled transistors 504. A predetermined number of NMOS transistors are used for illustration purposes here, wherein n is the number of serially coupled transistors and n can also be 1. A first transistor 504 has its drain coupled with the input 502. A source of the last transistor is connected with the output 502'. Each transistor 504 has its gate coupled to its drain so that the transistor operates in effectively diode mode. The total voltage drop in higher voltage regulating circuit 112 is n*VDS, where VDS is the forward drain to source voltage drop of transistor 504. As such, the second regulating circuit limits the second high voltage to Vin−n*VDS.

Figure 6:
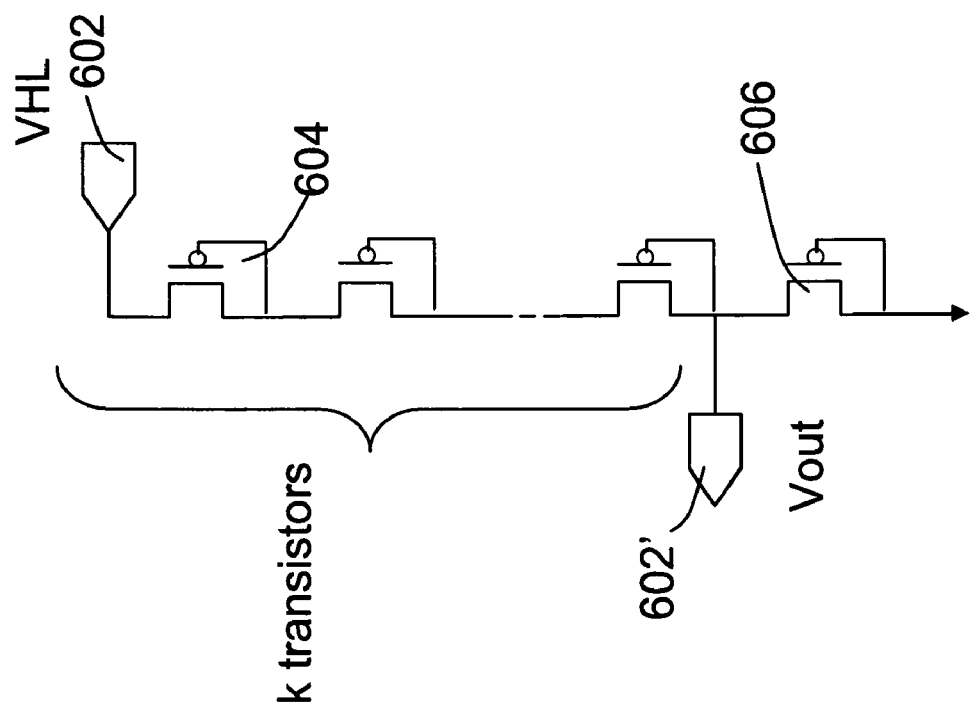
FIG. 6 is a circuit diagram of a voltage divider circuit for converting the first or second voltage to a lower voltage to be monitored according to one embodiment of the present invention.

The system 100 also comprises a voltage divider circuit 116, the circuit diagram of which is depicted in FIG. 6. The divider circuit 116 converts the high voltage, connected to the output terminal, to a lower voltage that could be determined and monitored by a low voltage pad.

The voltage divider 116 comprises an input 602 that is connected to the output 103 of the system 100, and an output 602' for being coupled to a low voltage pad for determining and monitoring the high voltage.

The voltage divider comprises a first set of serially coupled transistors 604 (e.g., 3 transistors are shown in FIG. 6 for representing k number of transistors), and a second set of serially coupled transistors 606 (e.g., a single transistor is shown for representing a predetermined number of transistors). The first set and the second sets are connected together serially in a voltage divider manner, so that the low voltage Vout at output 602' is determined by the high voltage VHL, the total number of transistors in the first set, and the total number of transistors in the second set. In this embodiment, the transistors 604 and 606 are FET transistors, such as PMOS transistors.

In the above example, if the number of transistors m in the first voltage regulating circuit is 1, the number of transistors n in the second voltage regulating circuit is 2, the number of transistors k in circuit of FIG. 6 is 9, and the system 100 is connected to an external voltage Vext=12V. The first high voltage of $V_{HL}$ will be around 13.5V, the second high voltage of $V_{HL}$ will be around 10.7V and the low voltage Vout for monitoring purposes is VHL*(k+1)$^{-1}$ is equal to ⅒VHL, i.e., 1.35V for the first high voltage and 1.07V for the second high voltage.

Compared to conventional solutions, high voltage generation and regulating system is less complicated and can be manufactured in a smaller size. Also, the device according to invention is more cost effective. The invention generating dual high voltage levels use fewer transistors than prior art.

Another aspect of the invention is implementing a detecting circuit for detecting internal high voltage level, which output can be used by low voltage output pad. In conventional solutions, high voltage output pads are used to detect high voltage levels.

The invention allows manufacturing low cost non volatile memories and providing smaller circuit size. The system provides voltage higher than the external voltage for erase operation, and voltage lower than the external voltage for program operation. It also allows determining and monitoring the internal high voltage without need for an extra high voltage pad.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A voltage generation system for generating two or more operating voltages for a non-volatile memory, the system comprising:
   an input terminal for receiving an external voltage;
   a charge pump for producing a first high voltage based on the external voltage to be higher than the external voltage;
   a first regulating circuit for regulating the first high voltage to a lower predetermined voltage;
   a second regulating circuit for generating a second high voltage based on the external voltage to be lower than the external voltage, and
   wherein the first and second high voltages are selectively switched to operate the non-volatile memory for erasing or programming thereof, and
   wherein an output of the first regulating circuit and an input of the second regulating circuit are coupled together, and an input of the first regulating circuit and an output of the second regulating circuit are coupled together via a switching circuit.

2. The system of claim 1, wherein the first regulating circuit further comprises a set of one or more serially coupled transistors operating in a diode mode for causing a first predetermined voltage drop.

3. The system of claim 2, wherein the second regulating circuit further comprises a set of one or more serially coupled transistors operating in a diode mode for causing a second predetermined voltage drop.

4. The system of claim 3, wherein the transistors are NMOS transistors with drains coupled to gates thereof.

5. The system of claim 1, wherein the switching circuit is selectively connected to outputs of the charge pump and the second regulating circuit for providing the first or second high voltage.

6. The system as in claim 1, further comprising a voltage divider circuit coupled to the first and second high voltages for reducing them to low voltages for monitoring the same.

7. The system of claim 6, wherein the voltage divider circuit further comprises a set of one or more serially coupled transistors.

8. The system of claim 7, wherein the transistors are PMOS transistors operating in diode mode.

9. A voltage generation system for generating two or more operating voltages for a non-volatile memory, the system comprising:
   an input terminal for receiving an external voltage;
   a charge pump for producing a first high voltage based on the external voltage to be higher than the external voltage;
   a first regulating circuit for regulating the first high voltage to a lower predetermined voltage;
   a second regulating circuit for generating a second high voltage based on the external voltage to be lower than the external voltage;
   a monitoring circuit for reducing the first or second high voltages to a lower voltage for monitoring the same, and
   wherein the first and second high voltages are selectively switched to operate the non-volatile memory for erasing or programming thereof, and
   wherein an output of the first regulating circuit and an input of the second regulating circuit are coupled together, and an input of the first regulating circuit and an output of the second regulating circuit are coupled together via a switching circuit.

10. The system of claim 9, wherein the first regulating circuit further comprises a set of one or more serially coupled transistors operating in a diode mode for causing a first predetermined voltage drop.

11. The system of claim 10, wherein the second regulating circuit further comprises a set of one or more serially coupled transistors operating in a diode mode for causing a second predetermined voltage drop.

12. The system of claim 11, wherein the transistors are NMOS transistors with drains coupled to gates thereof.

13. The system of claim 9, wherein the switching circuit is selectively connected to outputs of the charge pump and the second regulating circuit for providing the first or second high voltage.

14. The system as in claim 9, wherein the monitoring circuit further comprises a voltage divider circuit with a set of one or more serially coupled transistors.

15. The system of claim 14, wherein the transistors are PMOS transistors operating in diode mode.

16. A voltage generation system for generating two or more operating voltages for a non-volatile memory, the system comprising:
   an input terminal for receiving an external voltage;
   a charge pump for producing a first high voltage based on the external voltage to be higher than the external voltage;
   a first regulating circuit for regulating the first high voltage to a lower predetermined voltage;
   a second regulating circuit for generating a second high voltage based on the external voltage to be lower than the external voltage;
   a monitoring circuit for reducing the first or second high voltages to a lower voltage for monitoring the same, and
   wherein the first and second high voltages are selectively switched to operate the non-volatile memory for erasing or programming thereof,
   wherein an output of the first regulating circuit and an input of the second regulating circuit are coupled together, and an input of the first regulating circuit and an output of the second regulating circuit are coupled together via a switching circuit, and
   wherein the first and regulating circuits each further comprises a set of one or more serially coupled transistors operating in a diode mode for causing a predetermined voltage drop.

17. The system of claim 16, wherein the switching circuit is selectively connected to outputs of the charge pump and the second regulating circuit for providing the first or second high voltage.

18. The system as in claim 16, the monitoring circuit further comprises a voltage divider circuit with a set of one or more serially coupled transistors.

* * * * *